United States Patent
Nakano et al.

(10) Patent No.: US 9,536,998 B2
(45) Date of Patent: Jan. 3, 2017

(54) SEMICONDUCTOR DEVICE AND SEMICONDUCTOR DEVICE MANUFACTURING METHOD

(71) Applicant: ROHM CO., LTD., Kyoto-shi, Kyoto (JP)

(72) Inventors: Yuki Nakano, Kyoto (JP); Ryota Nakamura, Kyoto (JP); Hiroyuki Sakairi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/397,073

(22) PCT Filed: Apr. 22, 2013

(86) PCT No.: PCT/JP2013/061765
§ 371 (c)(1),
(2) Date: Oct. 24, 2014

(87) PCT Pub. No.: WO2013/161753
PCT Pub. Date: Oct. 31, 2013

(65) Prior Publication Data
US 2015/0295079 A1    Oct. 15, 2015

(30) Foreign Application Priority Data
Apr. 27, 2012  (JP) ................................. 2012-103862

(51) Int. Cl.
*H01L 29/66* (2006.01)
*H01L 21/3205* (2006.01)
(Continued)

(52) U.S. Cl.
CPC ..... *H01L 29/7813* (2013.01); *H01L 21/02233* (2013.01); *H01L 21/049* (2013.01);
(Continued)

(58) Field of Classification Search
CPC ............. H01L 29/7813; H01L 29/1095; H01L 29/401; H01L 29/41741; H01L 29/4236; H01L 29/42368; H01L 29/66068; H01L 29/66734; H01L 21/02233; H01L 21/049; H01L 29/7811; H01L 29/0634
(Continued)

(56) References Cited

U.S. PATENT DOCUMENTS 5,072,266 A    12/1991    Bulucea et al.
5,541,425 A    7/1996     Nishihara
(Continued)

FOREIGN PATENT DOCUMENTS

EP    0 676 814 A2    10/1995
JP    7-249769 A      9/1995
(Continued)

OTHER PUBLICATIONS

International Preliminary Report on Patentability and Written Opinion; PCT/JP2013/061765 (6 pages).
(Continued)

*Primary Examiner* — Ha Nguyen
*Assistant Examiner* — Dzung Tran
(74) *Attorney, Agent, or Firm* — Hamre, Schumann, Mueller & Larson, P.C.

(57) ABSTRACT

[Problem] To provide a semiconductor device wherein withstand voltage of a gate insulating film at the upper edge of a trench is improved, and a method for manufacturing the semiconductor device.
[Solution] A semiconductor device (1) includes: an n-type SiC substrate (2) having a gate trench (9) formed therein; a gate insulating film (16), which integrally includes a side-surface insulating film (18) and a bottom-surface insulating film (19); and a gate electrode (15) which is embedded in the gate trench (9), and which selectively has an overlap portion
(Continued)

(17) that overlaps, at the upper edge (26), the surface (21) of the SiC substrate (2). In the side-surface insulating film (18), an overhung portion (27) that is selectively thick compared with other portions of the side-surface insulating film (18) is formed such that the overhung portion protrudes, at the upper end edge (26), toward the inside of the gate trench (9).

13 Claims, 8 Drawing Sheets

(51) Int. Cl.
| | |
|---|---|
| H01L 29/78 | (2006.01) |
| H01L 21/04 | (2006.01) |
| H01L 29/423 | (2006.01) |
| H01L 29/40 | (2006.01) |
| H01L 29/417 | (2006.01) |
| H01L 29/10 | (2006.01) |
| H01L 21/02 | (2006.01) |
| H01L 29/16 | (2006.01) |
| H01L 29/06 | (2006.01) |
| H01L 21/324 | (2006.01) |

(52) U.S. Cl.
CPC ........ *H01L 29/1095* (2013.01); *H01L 29/401* (2013.01); *H01L 29/41741* (2013.01); *H01L 29/4236* (2013.01); *H01L 29/42368* (2013.01); *H01L 29/66068* (2013.01); *H01L 29/66734* (2013.01); *H01L 29/7811* (2013.01); *H01L 21/02255* (2013.01); *H01L 21/3247* (2013.01); *H01L 29/0634* (2013.01); *H01L 29/1608* (2013.01)

(58) Field of Classification Search
USPC .................................. 257/330, 335; 438/589
See application file for complete search history.

(56) References Cited

U.S. PATENT DOCUMENTS

| | | | |
|---|---|---|---|
| 5,723,376 A | 3/1998 | Takeuchi et al. | |
| 5,795,792 A | 8/1998 | Nishihara | |
| 6,303,460 B1 * | 10/2001 | Iwamatsu | 438/401 |
| 6,455,378 B1 | 9/2002 | Inagawa et al. | |
| 6,825,087 B1 * | 11/2004 | Sharp et al. | 438/296 |
| 2001/0008291 A1 * | 7/2001 | Aoki et al. | 257/330 |
| 2002/0167046 A1 | 11/2002 | Aoki et al. | |
| 2004/0173844 A1 | 9/2004 | Williams et al. | |
| 2004/0183129 A1 | 9/2004 | Williams et al. | |
| 2004/0183136 A1 | 9/2004 | Williams et al. | |
| 2004/0195618 A1 | 10/2004 | Saito et al. | |
| 2005/0263852 A1 * | 12/2005 | Ogura et al. | 257/565 |
| 2006/0014349 A1 | 1/2006 | Williams et al. | |
| 2006/0160306 A1 | 7/2006 | Huang et al. | |
| 2007/0075362 A1 | 4/2007 | Wu | |
| 2010/0193862 A1 | 8/2010 | Kanazawa | |
| 2011/0018004 A1 | 1/2011 | Shimizu et al. | |
| 2011/0291110 A1 | 12/2011 | Suzuki et al. | |
| 2012/0049202 A1 * | 3/2012 | Nakano | 257/77 |
| 2012/0052642 A1 | 3/2012 | Endo et al. | |
| 2012/0261714 A1 * | 10/2012 | Taketani | H01L 21/28211 257/139 |
| 2012/0261746 A1 * | 10/2012 | Darwish et al. | 257/330 |

FOREIGN PATENT DOCUMENTS

| | | |
|---|---|---|
| JP | 9-307101 | 11/1997 |
| JP | 10-154810 A | 6/1998 |
| JP | 10-200104 A | 7/1998 |
| JP | 2001-127284 A | 5/2001 |
| JP | 2004-311716 A | 11/2004 |
| JP | 2006-520091 | 8/2006 |
| JP | 2007-48769 A | 2/2007 |
| JP | 2009-71009 A | 4/2009 |
| JP | 2010-118701 | 5/2010 |
| JP | 2010-182857 A | 8/2010 |
| JP | 2010-245256 A | 10/2010 |
| JP | 2011-253837 A | 12/2011 |
| WO | WO 2004/079794 | 9/2004 |
| WO | 2010/119789 A1 | 10/2010 |

OTHER PUBLICATIONS

Extended Search Report issued in counterpart European patent application No. 13781066.9, Nov. 4, 2015 (10 pages).

* cited by examiner

FIG. 2
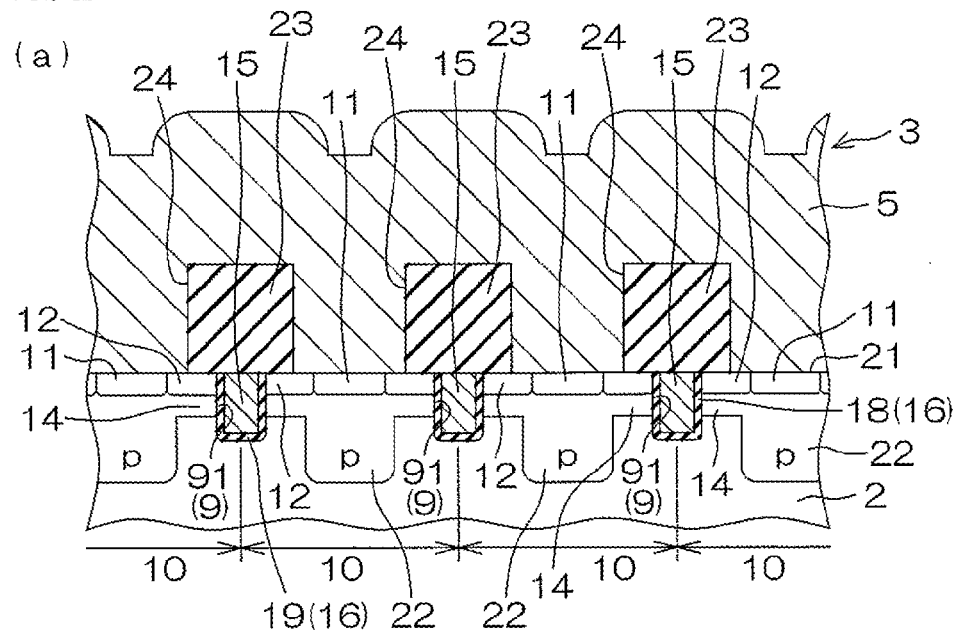
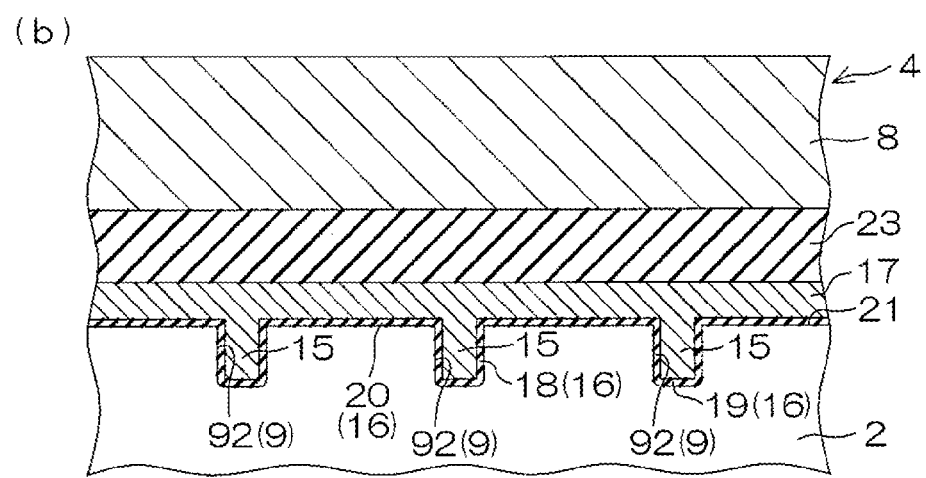
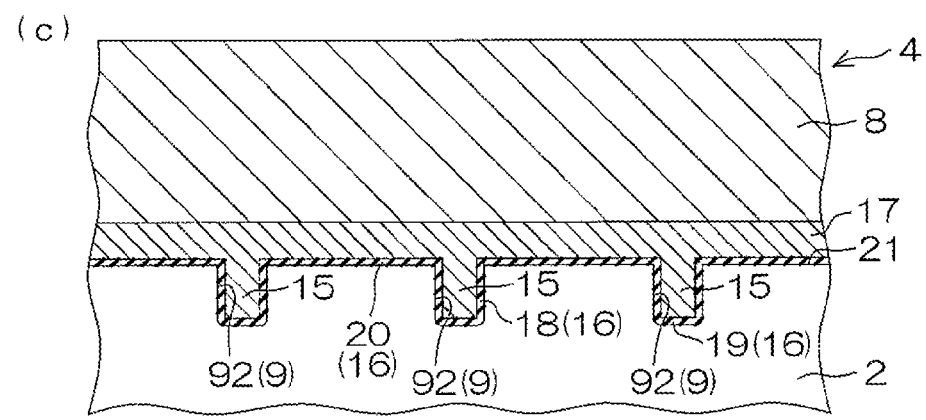

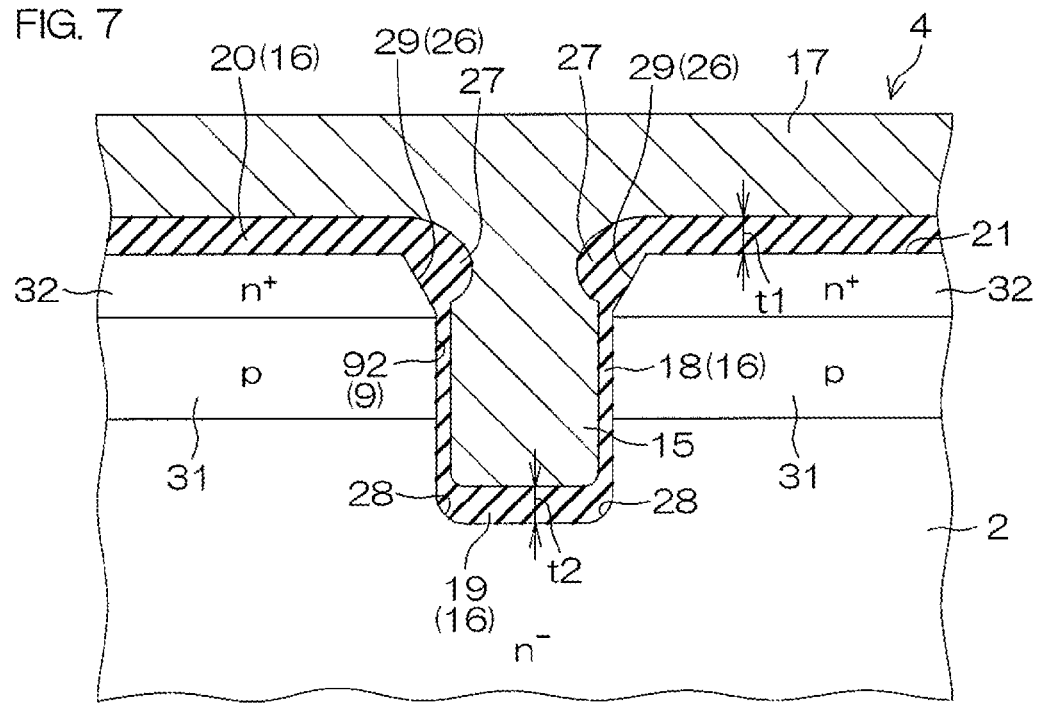
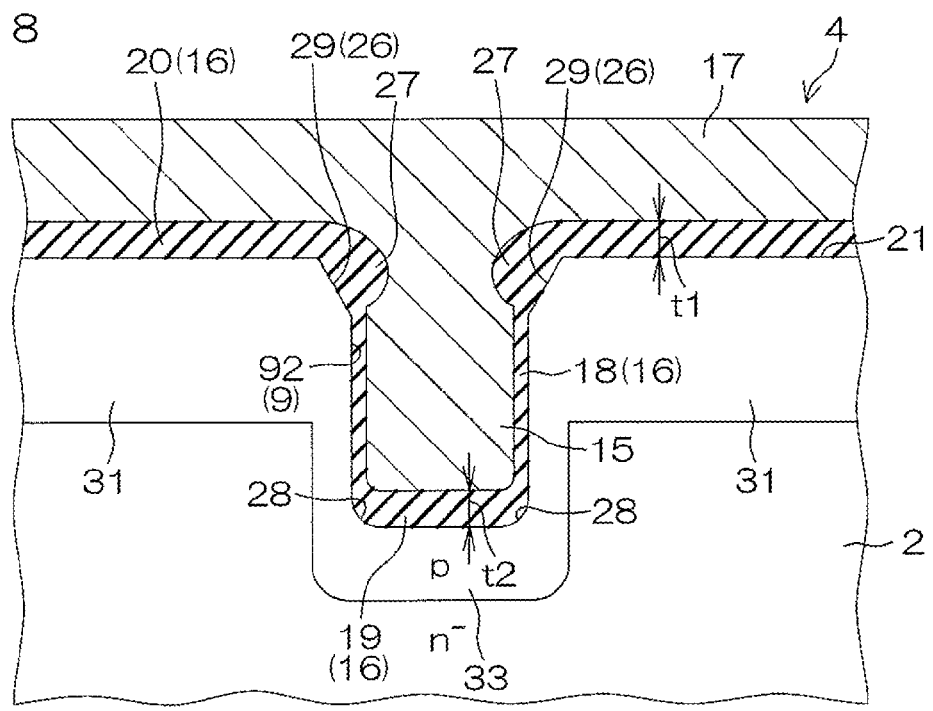

SEMICONDUCTOR DEVICE AND SEMICONDUCTOR DEVICE MANUFACTURING METHOD

TECHNICAL FIELD

The present invention relates to a semiconductor device having a trench-gate structure and a method of manufacturing the same.

BACKGROUND ART

For example, Patent Literature 1 discloses a trench-gate vertical MOSFET including an epitaxial layer formed thereon with an active cell array and a gate bus area, a gate trench formed in the active cell array, a gate oxide film formed in the gate trench, a gate electrode made of polysilicon embedded in the gate trench, a trench formed in the gate bus area and being connected to the gate trench, and a gate bus including polysilicon embedded in the trench so that the surface of the epitaxial layer is covered in the gate bus area.

CITATION LIST

Patent Literature

Patent Document 1: Japanese Translation of International Application (Translation of PCT Application) No. 2006-520091

SUMMARY OF INVENTION

Solution to Problem

A semiconductor device of the present invention includes a semiconductor layer of a first conductive type formed thereon with a gate trench, a gate insulating film formed on a side surface and on a bottom surface of the gate trench, the gate insulating film integrally including a side-surface insulating film on the side surface and a bottom-surface insulating film on the bottom surface, and a gate electrode embedded in the gate trench, the gate electrode selectively having an overlap portion overlapping the surface of the semiconductor layer in an upper edge formed at an opening end of the gate trench, in which the side-surface insulating film includes an overhung portion selectively thicker than other portions of the side-surface insulating film so as to protrude inwardly of the gate trench at the upper edge (Aspect 1).

According to this arrangement, the overhung portion is formed at the upper edge of the gate trench, and thus, it is possible to improve the withstand voltage of the gate insulating film at the upper edge. Thus, even if an electric field is concentrated at the upper edge when the gate is turned on, it is possible to prevent a dielectric breakdown of the gate insulating film at the upper edge. As a result, it is possible to improve the reliability in a gate-on voltage.

It is preferable that the upper edge of the gate trench includes an inclined surface allowing continuation between the surface of the semiconductor layer and the side surface of the gate trench (Aspect 2).

Thus, it is possible to disperse the electric field applied to the upper edge when the gate is turned on to within the inclined surface to alleviate an electric field concentration.

It is preferable that the upper edge of the gate trench includes a circular surface allowing continuation between the surface of the semiconductor layer and the side surface of the gate trench (Aspect 3).

Thus, it is possible to disperse the electric field applied to the upper edge when the gate is turned on to within the circular surface to alleviate an electric field concentration.

It is preferable that the bottom-surface insulating film is thicker than other portions of the side-surface insulating film (Aspect 4).

Thus, it is possible to reduce the capacitance of a capacitor arranged by the gate electrode and the semiconductor layer facing each other via the bottom-surface insulating film. As a result, it is possible to reduce the capacity of the entire gate (gate capacitance). In addition, it is possible to improve the withstand voltage of the bottom-surface insulating film to prevent a dielectric breakdown of the bottom-surface insulating film when the gate is turned off.

It is preferable that the gate insulating film further includes a planar insulating film formed on the surface of the semiconductor layer, and the planar insulating film is thicker than other portions of the side-surface insulating film (Aspect 5).

Thus, it is possible to reduce the capacitance of a capacitor arranged by the gate electrode (overlap portion) and the semiconductor layer facing each other via the planar insulating film. As a result, it is possible to reduce the capacity of the entire gate (gate capacitance).

It is preferable that the lower edge on the bottom portion of the gate trench includes a circular surface allowing continuation between the side surface and the bottom surface of the gate trench.

Thus, it is possible to disperse the electric field applied to a lower edge when the gate is turned off to within the circular surface to alleviate an electric field concentration.

It is preferable that the semiconductor layer includes an active region in which a trench gate type MIS transistor is formed, and an inactive region which is a region outside the active region and in which the overhung portion is formed, in which, in the active region, the semiconductor layer includes a first conductive-type source layer formed in a manner being exposed at the surface side of the semiconductor layer to define a portion of the side surface of the gate trench, a second conductive-type channel layer formed in a manner contacting the source layer at a back surface side of the semiconductor layer relative to the source layer to define a portion of the side surface of the gate trench, and a first conductive-type drift layer formed in a manner contacting the channel layer at aback surface side of the semiconductor layer relative to the channel layer to define the bottom surface of the gate trench, in which, in the inactive region, the semiconductor layer includes a second conductive-type layer formed at the same depth as the channel layer (Aspect 7).

Thus, it is possible to form the second conductive-type layer in the inactive region by the same step as that for the channel layer in the active region to simplify a step of manufacturing a semiconductor device. When the semiconductor layer is of n-type and the second conductive-type layer is a p-type layer, it is possible to reduce a contact area between the gate insulating film and an n-type semiconductor to reduce a leak current and also to reduce a gate capacitance.

It is preferable that, in the inactive region, the semiconductor layer further includes a first conductive-type layer formed at the same depth as the source layer (Aspect 8).

Thus, it is possible to form the first conductive-type layer in the inactive region by the same step as that for the source layer in the active region to simplify a step of manufacturing a semiconductor device.

It is preferable that, in the active region, the semiconductor layer further includes a second conductive-type pillar layer which is formed within the drift layer in a manner continuing to the channel layer and which extends from the channel layer toward the back surface of the semiconductor layer, and, in the inactive region, the semiconductor layer further includes a bottom portion second conductive-type layer which is formed at the same depth as the pillar layer in a manner continuing to the second conductive-type layer and which defines the bottom surface of the gate trench (Aspect 9).

Thus, it is possible to generate, near the gate trench, a depletion layer generated by junction between the bottom portion second conductive-type layer and the semiconductor layer (pn junction). The presence of the depletion layer can then keep an equipotential surface away from the gate insulating film. As a result, it is possible to alleviate the electric field applied to the gate insulating film on the bottom portion of the gate trench. Further, it is possible to form the bottom portion second conductive-type layer in the inactive region by the same step as that for the pillar layer in the active region to simplify a step of manufacturing a semiconductor device.

It may be possible that the inactive region includes an outer circumferential region surrounding the active region, and the semiconductor device includes a gate finger which is arranged to surround the active region along the outer circumferential region, and is electrically connected to the overlap portion of the gate electrode (Aspect 10).

Thus, it is possible to prevent a dielectric breakdown of the gate insulating film contacting the overlap portion immediately below the gate finger.

It is preferable that the gate trench is formed to have a lattice shape in the active region and formed to have a stripe shape which is pulled from the end of the lattice-shaped trench in the outer circumferential region, and the gate finger is laid along a direction to cross the stripe-shaped trench (AsPect 11).

It is preferable that the semiconductor device further includes an interlayer film formed on the surface of a semiconductor layer to cover the gate electrode, in which the gate finger includes, in a width direction center thereof, a contact portion contacting the gate electrode to penetrate through the interlayer film (Aspect 12).

It is preferable that the contact portion is formed linearly to surround the active region along the outer circumferential region (Aspect 13).

It is preferable that the gate electrode includes polysilicon and the gate finger includes aluminum (Aspect 14).

A method of manufacturing a semiconductor device according to the present invention includes a step of forming a gate trench in a semiconductor layer of a first conductive type, a step of forming a gate insulating film on a side surface and a bottom surface of the gate trench by depositing an insulating material within the gate trench by using a CVD method under a predetermined condition so as to form an overhung portion selectively thicker than other portions at an upper edge formed at an opening end of the gate trench, and a step of embedding the gate electrode in the gate trench so that the overlap portion overlapping the surface of the semiconductor layer is selectively formed at the upper edge (Aspect 15).

According to this method, the overhung portion is formed at the upper edge of the gate trench, and thus, it is possible to improve the withstand voltage of the gate insulating film at the upper edge, in the obtained semiconductor device. Thus, even if an electric field is concentrated at the upper edge when the gate is turned on, it is possible to prevent a dielectric breakdown of the gate insulating film at the upper edge. As a result, it is possible to improve the reliability in a gate-on voltage.

It is preferable that the method of manufacturing a semiconductor device further includes a step of forming, at the upper edge, an inclined surface allowing continuation between the surface of the semiconductor layer and the side surface of the gate trench by forming a sacrificial oxide film on the side surface and the bottom surface of the gate trench by using a thermal oxidation method before the formation of the gate insulating film (Aspect 16).

In the semiconductor device obtained by this method, it is possible to disperse the electric field applied to the upper edge when the gate is turned on to within the inclined surface to alleviate an electric field concentration.

It is preferable that the method of manufacturing a semiconductor device further includes a step of forming, at the upper edge, a circular surface allowing continuation between the surface of the semiconductor layer and the side surface of the gate trench by performing hydrogen annealing treatment on the semiconductor layer before the formation of the gate insulating film (Aspect 17).

In the semiconductor device obtained by this method, it is possible to disperse the electric field applied to the upper edge when the gate is turned on to within the circular surface to alleviate an electric field concentration.

BRIEF DESCRIPTION OF DRAWINGS

FIGS. 2 (*a*), 2 (*b*), and 2 (*c*) are each cross-sectional views of the semiconductor device, where FIG. 2 (*a*) is a cross-sectional view taken along a cutting plane line IIa-IIa in FIG. 1 (*b*), FIG. 2 (*b*) is a cross-sectional view taken along a cutting plane line IIb-IIb in FIG. 1 (*b*), and FIG. 2 (*c*) is a cross-sectional view taken along a cutting plane line IIc-IIc in FIG. 1 (*b*).

FIG. 7 is a cross-sectional view showing a fifth embodiment of a gate finger portion of the semiconductor device.

FIG. 8 is a cross-sectional view showing a sixth embodiment of a gate finger portion of the semiconductor device.

DETAILED DESCRIPTION OF EMBODIMENTS

Embodiments of the present invention will hereinafter be described in detail with reference to the accompanying drawings.

Figure 1:
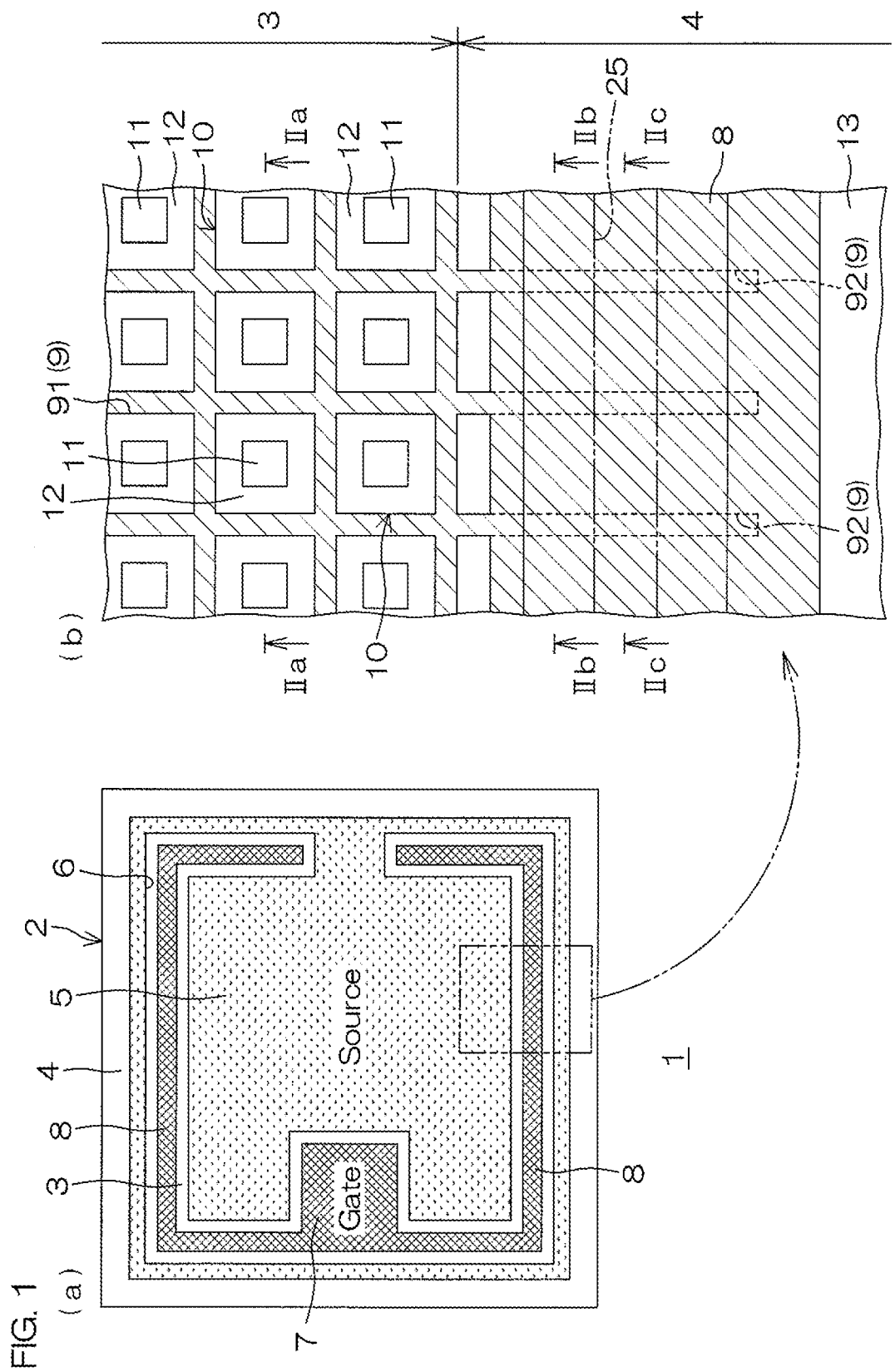
FIGS. 1 (*a*) and 1 (*b*) are schematic plan views of a semiconductor device according to a embodiment of the present invention, where FIG. 1 (*a*) is an overall view and FIG. 1 (*b*) is an enlarged interior view.

FIGS. 1 (*a*) and 1 (*b*) are schematic plan views of a semiconductor device according to a embodiment of the present invention, where FIG. 1 (*a*) is an overall view and FIG. 1 (*b*) is an enlarged interior view.

A semiconductor device 1 includes a power MOSFET (Metal-Oxide-Semiconductor Field Effect Transistor) element (individual element) using SiC (silicon carbide) and has a vertical length of about 1 mm in the sheet of FIG. 1, for example.

As shown in FIG. 1 (*a*), the semiconductor device 1 includes an active region 3 and an outer circumferential region 4. The active region 3 is configured to act as a field effect transistor and is placed at a center portion on an SiC substrate 2 as an example of a semiconductor layer The outer circumferential region 4, as an inactive region, surrounds the active region 3. A source pad 5 including aluminum, for example, is formed to cover a substantially entire region of the active region 3. In the embodiment, the source pad 5 is of squared shape in a plan view. At a circumferential edge portion of the source pad 5, a removal region 6 surrounding a central region of the source pad 5 is formed along the outer circumferential region 4. A portion of the removal region 6 is selectively recessed toward the central region of the source pad 5. A gate pad 7 is disposed in the recess. A gate finger 8 including aluminum, for example, extends over the entire removal region 6 from the gate pad 7 along the outer circumferential region 4. In the embodiment, a pair of gate fingers 8 are formed in a shape symmetrical to the gate pad 7.

As shown in FIG. 1 (*b*), a gate trench 9 is formed on the SiC substrate 2. The gate trench 9 is disposed directly beneath the source pad 5, etc. The gate trench 9 is formed across the active region 3 and the outer circumferential region 4. The gate trench 9 includes an active trench 91 that is formed to have a lattice shape in the active region 3 and that is configured to be used as a gate of an MOSFET, and a contact trench 92 that is formed to have a stripe shape pulled from each end of the active trench 91 to the outer circumferential region 4 and that is configured to act as a contact to a gate electrode 15 (described later) within the active trench 91. The contact trench 92 is arranged by an extended portion of the active trench 91. It should be noted that the patterns of the active trench 91 and the contact trench 92 are not limited to these shapes, etc. For example, the active trench 91 may have a stripe shape and a honeycomb shape. The contact trench 92 may have a lattice shape and a honeycomb shape, etc.

The active region 3 is divided by the active trench 91 into a larger number of unit cells 10. In the active region 3, the large number of unit cells 10 are arrayed regularly in a matrix. On an upper surface of each unit cell 10, a p$^+$-type channel contact layer 11 is formed at a central region thereof, and an n$^+$-type source layer 12 is formed to surround the p$^+$-type channel contact layer 11. The n$^+$-type source layer 12 forms a side surface of each unit cell 10 (side surface of the active trench 91).

In the outer circumferential region 4, the gate finger 8 is laid along a direction to cross the stripe-shaped contact trench 92. In the embodiment, the gate finger 8 is laid in a region inside of a longitudinal direction terminal portion (end portion on the opposite side of the active trench 91) of the contact trench 92, and the terminal portion of the contact trench 92 protrudes outwardly of the gate finger 8. On the SiC substrate 2 in a region further outside of the terminal portion, a lower step portion 13 is dug down. The lower step portion 13 is formed throughout the whole of the outer circumferential region 4.

Next, a basic cross-sectional structure of the active region 3 and the outer circumferential region 4 of the semiconductor device 1 will be described.

FIGS. 2 (*a*), 2 (*b*), and 2 (*c*) are each cross-sectional views of the semiconductor device, where FIG. 2 (*a*) is a cross-sectional view taken along a cutting plane line IIa-IIa in FIG. 1 (*b*), FIG. 2 (*b*) is a cross-sectional view taken along a cutting plane line IIb-IIb in FIG. 1 (*b*), and FIG. 2 (*c*) is a cross-sectional view taken along a cutting plane line IIc-IIc in FIG. 1 (*b*).

As described above, the semiconductor device 1 includes the SiC substrate 2. In the embodiment, the SiC substrate 2 is an n-type, that is, a first conductive type, and is configured to act as a drain region (drift layer) of a field effect transistor.

On a surface 21 side of the SiC substrate 2, a p-type channel layer 14 is formed. Within the p-type channel layer 14, the n$^+$-type source layer 12 and the p$^+$-type channel contact layer 11 as an example of a second conductive-type impurity region are formed. The p$^+$-type channel contact layer 11 is surrounded by the n$^+$-type source layer 12. The n$^+$-type source layer 12 and the p$^+$-type channel contact layer 11 are both exposed to the surface 21 of the SiC substrate 2.

The gate trench 9 is formed on a surface 21 side of the SiC substrate 2. The gate trench 9 penetrates through the n$^+$-type source layer 12 and the p-type channel layer 14 to reach a lower portion of the SiC substrate 2 which is for acting as the drain region of the semiconductor device. By the gate trench 9, the p-type channel layer 14 is divided into the large number of unit cells 10 arrayed in lattice, for example.

In the gate trench 9, the gate electrode 15 including polysilicon, for example, is embedded. A gate insulating film 16 is interposed between the gate electrode 15 and the SiC substrate 2.

The gate electrode 15 is embedded in the gate trench 9 (active trench 91) up to the surface 21 of the SiC substrate 2, in the active region 3, as shown by an oblique hatching in FIG. 1 (*b*), for example. Thus, the gate electrode 15 also is formed in a lattice shape, and the upper surface of each unit cell 10 is not covered with the gate electrode 15 and is exposed. On the other hand, in the outer circumferential region 4, the gate electrode 15 has an overlap portion 17 covering from an opening end of the gate trench 9 (contact trench 92) to the surface 21 of the SiC substrate 2. The overlap portion 17 crosses the stripe-shaped contact trench 92 along the gate finger 8, in the embodiment. The gate insulating film 16 integrally includes a side-surface insulating film 18 on the side surface of the gate trench 9, a bottom-surface insulating film 19 on the bottom surface, and a planar insulating film 20 on the surface 21 of the SiC substrate 2. In the embodiment, the planar insulating film 20 is interposed at least between the overlap portion 17 and the surface 21 of the SiC substrate 2.

In the active region 3, the gate electrode 15 is straddled between the n$^+$-type source layer 12 and the lower portion of SiC substrate 2 and is configured to control the formation of an inversion layer (channel) on the surface of the p-type channel layer 14 (side surface of the active trench 91). That is, the semiconductor device 1 includes a so-called trench gate type structured MOSFET.

In the active region 3, a p-type pillar layer 22 is formed within the lower portion of the SiC substrate 2. The p-type pillar layer 22 is formed in an inner region of the p-type channel layer 14 of each unit cell 10. More specifically, in this embodiment, the p-type pillar layer 22 is formed in a shape similar to, for example, the p-type channel layer 14 (in a quadrilateral shape in a plan view in the layout of FIG. 1(*b*)) in approximately the central region of the p-type channel layer 14. The p-type pillar layer 22 is formed to continue to the p-type channel layer 14 and extends toward the back surface of the SiC substrate 2 to a depth greater than the p-type channel layer 14. That is, the p-type pillar layer 22 is formed in an approximately pillar shape (in an approximately quadrangular prism shape in the layout of FIG. 1 (*b*)). Thus, on the SiC substrate 2, the p-type pillar layers 22 arrayed at a suitable pitch and the SiC substrate 2 for acting as the n-type drain region sandwiched between the respectively adjacent p type pillar layers 22 are alternately arrayed in a direction along the surface 21.

On the surface 21 of the SiC substrate 2, an interlayer film 23 including silicon oxide, for example, is formed. In the interlayer film 23, in the active region 3, a contact hole 24 is selectively formed in the central region of the p-type channel layer 14. The contact hole 24 is formed in a region allowing for selective exposure of one portion of the p$^+$-type channel contact layer 11 and n$^+$-type source layer 12 therearound. As shown in FIG. 1 (*b*), in the interlayer film 23, in the outer circumferential region 4, a contact hole 25 is selectively formed directly beneath the gate finger 8. In the embodiment, the contact hole 25 is formed linearly to surround the active region 3 along the outer circumferential region 4 in the width direction center of the gate finger 8.

On the interlayer film 23, the source pad 5 and the gate finger 8 (gate pad 7) are formed. The source pad 5 integrally enters into all the contact holes 24, and is connected to the n$^+$-type source layer 12 and the p$^+$-type channel contact layer 11 in each unit cell 10. Therefore, the n$^+$-type source layer 12 is the same in electrical potential as the source pad 5. The p-type channel layer 14 is connected via the p$^+$-type channel contact layer 11 to the source pad 5, and thus, the same in electrical potential as the source pad 5. The gate finger 8 enters into the contact hole 25 and is connected to the overlap portion 17 of the gate electrode 15. Therefore, the gate electrode 15 embedded in the active trench 91 is connected via the overlap portion 17 to the gate finger 8, and thus, the same in electrical potential as the gate finger 8 (gate pad 7).

In the semiconductor device 1 thus arranged, when an on-voltage is applied to the gate finger 8, the overlap portion 17 of the gate electrode 15 also is thereby applied the on-voltage. Thus, it is likely that the electric field generated from the overlap portion 17 concentrates at the upper edge of the contact trench 92. As a result, at the upper edge of the contact trench 92, the gate insulating film 16 may experience dielectric breakdown. Therefore, the inventors of the present application found a structure shown in FIG. 3 to FIG. 9 as a structure enabling prevention of the dielectric breakdown of such gate insulating film 16.

FIG. 3 to FIG. 9 each are a cross-sectional view showing first to seventh embodiments of the gate finger portion of the semiconductor device. In FIG. 4 to FIG. 9, identical reference signs are allotted to portions corresponding to each portion shown in the figures before FIG. 4 to FIG. 9.

Figure 3:
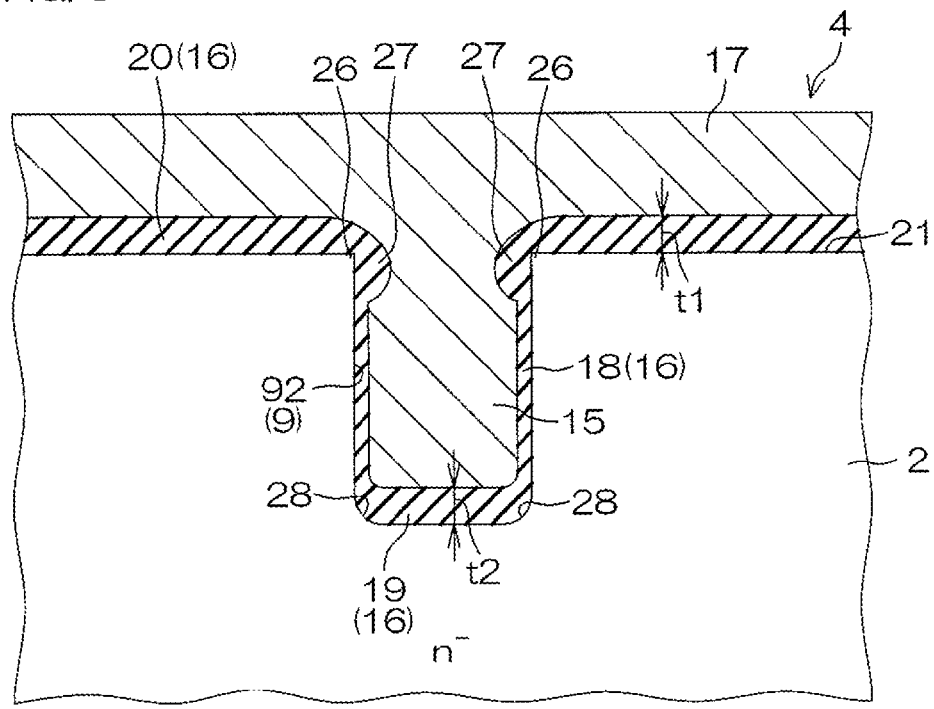
FIG. 3 is a cross-sectional view showing a first embodiment of a gate finger portion of the semiconductor device.

As shown in FIG. 3, in the first embodiment, the side-surface insulating film 18 includes the overhung portion 27 selectively thicker than other portions of the side-surface insulating film 18 so as to protrude inwardly of the contact trench 92 at the upper edge 26 of the contact trench 92. In this case, the upper edge 26 is a corner portion including a nodal line formed when the side surface of the contact trench 92 and the surface 21 of the SiC substrate 2 cross.

This provision of the overhung portion 27 enables improvement of withstand voltage of the gate insulating film 16 at the upper edge 26. Thus, even when the electric field is concentrated at the upper edge 26 when the gate is turned on, it is possible to prevent a dielectric breakdown of the gate insulating film 16 at the upper edge 26. As a result, it is possible to improve the reliability in a gate-on voltage.

As for a relationship in thickness of each portion of the gate insulating film 16, it is preferable that a thickness $t_2$ of the bottom-surface insulating film 19 is equal to or more than a thickness $t_1$ of the planar insulating film 20 ($t_2 \geq t_1$), and both of the thicknesses $t_1$ and $t_2$ are more than a thickness $t_3$ of the side-surface insulating film 18 (other than the overhung portion 27). That is, a relationship of $t_2 \geq t_1 > t_3$ is satisfied.

The arrangement enables a reduction in the capacitance of a capacitor arranged by the gate electrode 15 and the SiC substrate 2 for acting as the n-type drain region, that face each other with the bottom-surface insulating film 19 being interposed therebetween. As a result, it is possible to reduce the capacity of the entire gate (gate capacitance). Further, it is possible to improve the withstand voltage of the bottom-surface insulating film 19, and thus, it is also possible to prevent a dielectric breakdown of the bottom-surface insulating film 19 when the gate is turned off. The planar insulating film 20 is also thick, and thus, it is possible to reduce the capacitance of a capacitor arranged by the gate electrode 15 (overlap portion 17) and the SiC substrate 2 that acts as the n-type drain region, that face each other with the planar insulating film 20 being interposed therebetween. As a result, it is possible to reduce the capacity of the entire gate (gate capacitance).

The lower edge on the bottom portion of the contact trench 92 is the circular surface 28 allowing continuation between the side surface and the bottom surface of the contact trench 92. That is, the lower edge of the contact trench 92 is not sharp, but rounded by the circular surface 28.

According to this arrangement, it is possible to disperse the electric field applied to the lower edge when the gate is turned off to within the circular surface 28 so that it is possible to alleviate the electric field concentration at the lower edge.

Figure 4:
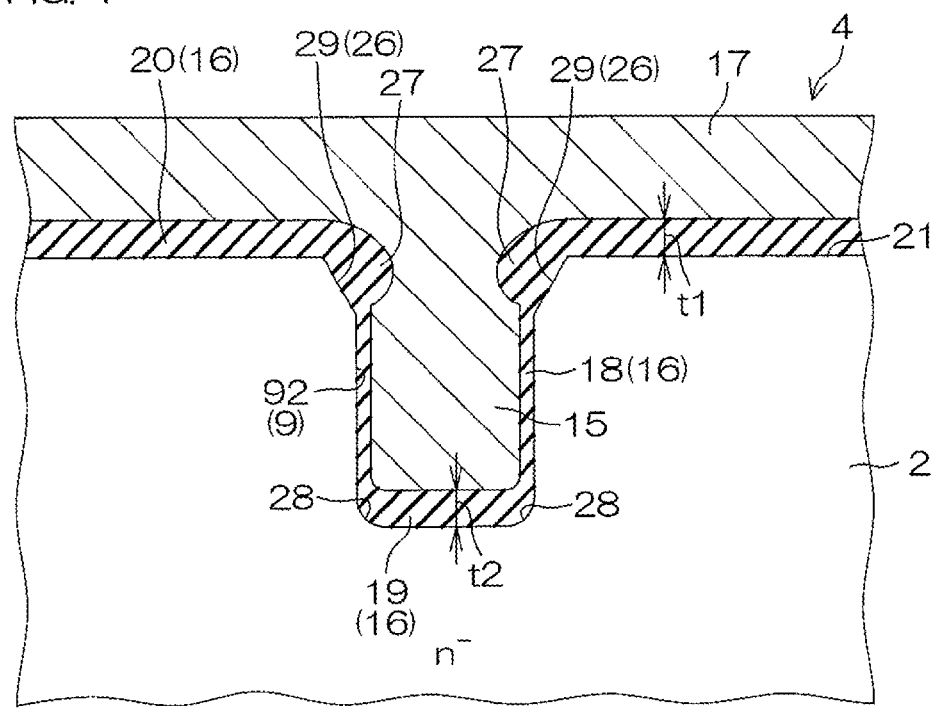
FIG. 4 is a cross-sectional view showing a second embodiment of a gate finger portion of the semiconductor device.

In the second embodiment shown in FIG. 4, the upper edge 26 of the contact trench 92 includes, in addition to the arrangement in FIG. 3, an inclined surface 29 allowing the continuation between the surface 21 of the SiC substrate 2 and the side surface of the contact trench 92. That is, the upper edge 26 of the contact trench 92 is in a chamfered shape.

According to this arrangement, it is possible to disperse the electric field applied to the upper edge 26 when the gate is turned on to within the inclined surface 29 so that it is possible to alleviate the electric field concentration at the upper edge 26.

Figure 5:
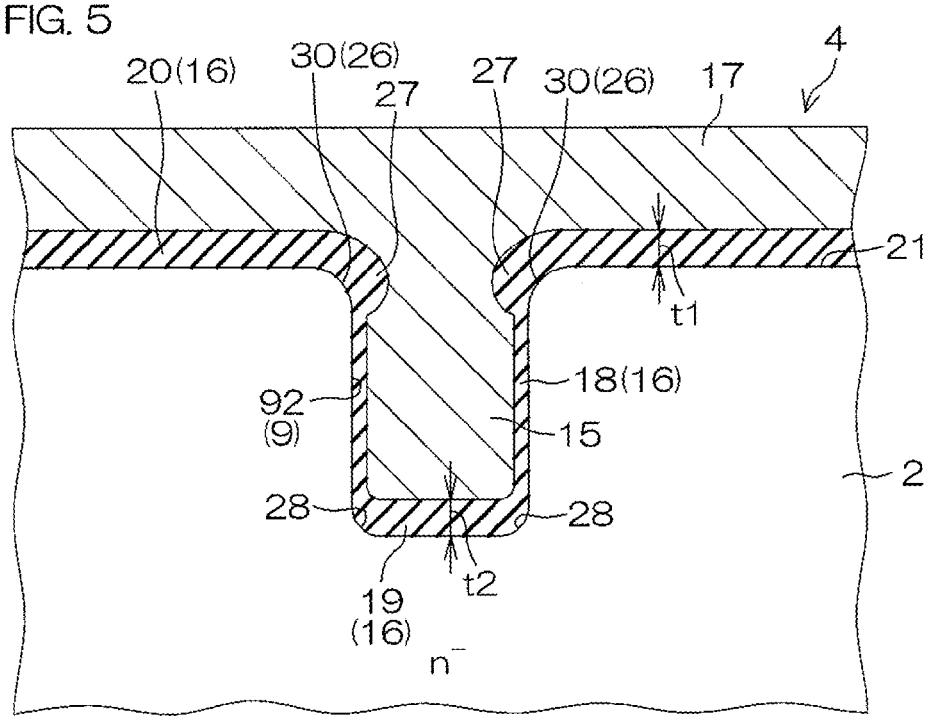
FIG. 5 is a cross-sectional view showing a third embodiment of a gate finger portion of the semiconductor device.

In the third embodiment shown in FIG. 5, the upper edge 26 of the contact trench 92 includes, in addition to the arrangement in FIG. 3, a circular surface 30 allowing the continuation between the surface 21 of the SiC substrate 2 and the side surface of the contact trench 92. That is, the upper edge 26 of the contact trench 92 is not sharp, but rounded by the circular surface 30.

According to this arrangement, it is possible to disperse the electric field applied to the upper edge 26 when the gate is turned on to within the circular surface 30 so that it is possible to alleviate the electric field concentration at the upper edge 26.

Figure 6:
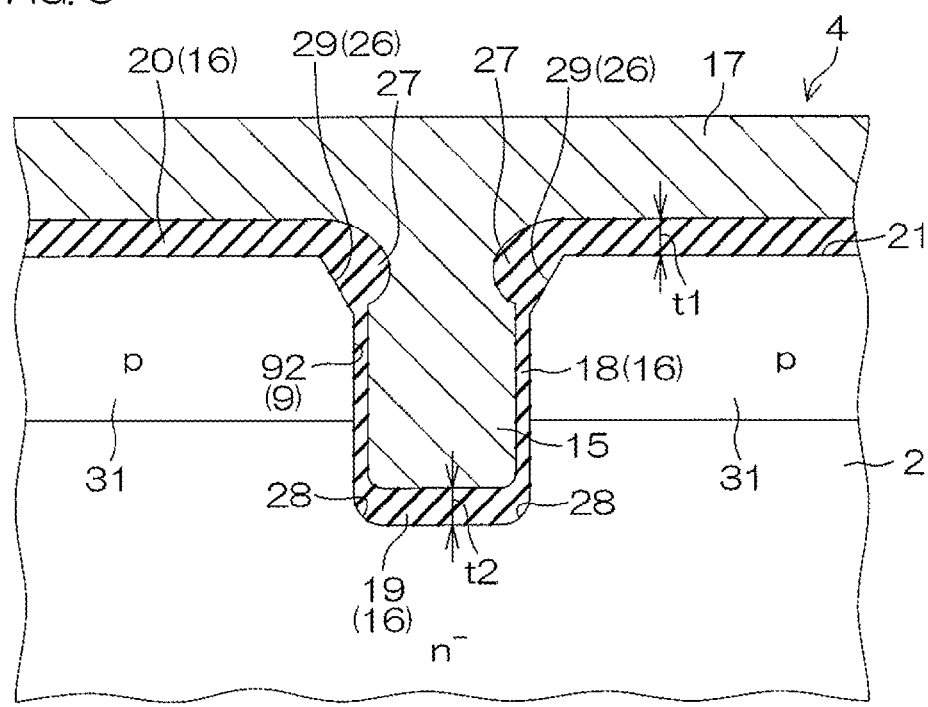
FIG. 6 is a cross-sectional view showing a fourth embodiment of a gate finger portion of the semiconductor device.
Figure 9:
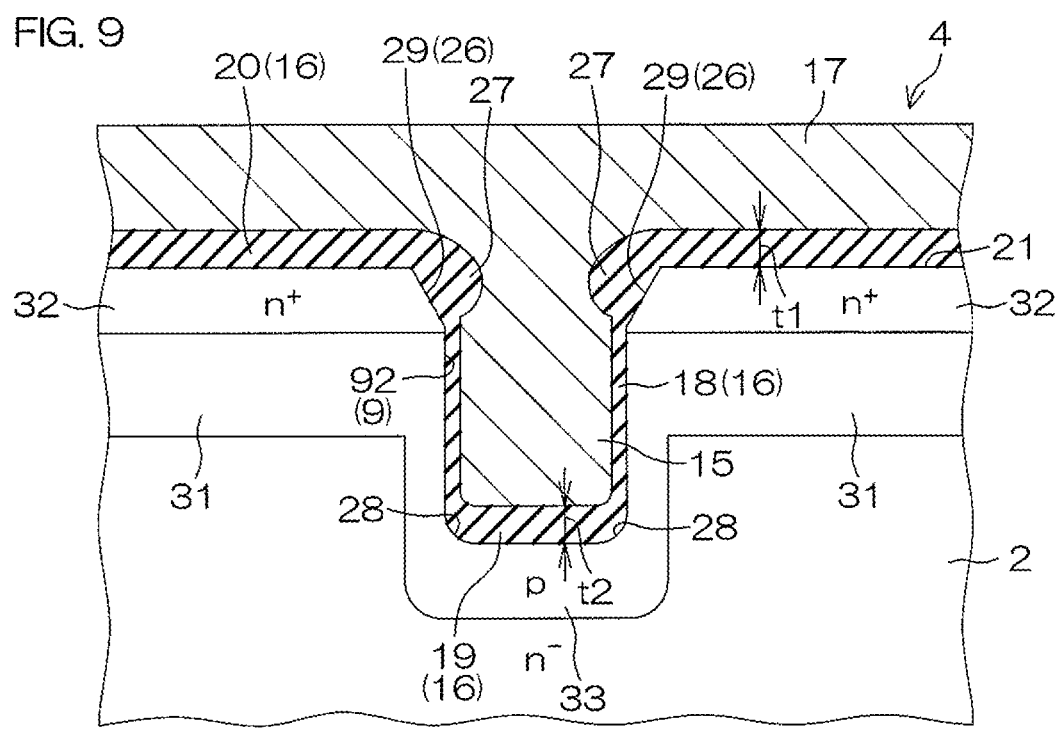
FIG. 9 is a cross-sectional view showing a seventh embodiment of a gate finger portion of the semiconductor device.

In the fourth embodiment shown in FIG. 6, in addition to the arrangement in FIG. 4, a p-type layer 31 is formed at the surface 21 side of the SiC substrate 2. The p-type layer 31 has the same depth as the p-type channel layer 14 (see FIG. 2 (a)) in the active region 3.

With this arrangement, it is possible to form the p-type layer 31 in the outer circumferential region 4 by the same step as that for the p-type channel layer 14 in the active region 3, and therefore, it is possible to simplify a step of manufacturing the semiconductor device 1. Further, it is possible to reduce a contact area between the gate insulating film 16 and the SiC substrate 2 for acting as the n-type drain region, and therefore, it is possible to reduce a leak current and also possible to reduce a gate capacitance.

In the fifth embodiment shown in FIG. 7, in addition to the arrangement in FIG. 6, an $n^+$-type layer 32 is formed within the p-type layer 31. The $n^+$-type layer 32 has the same depth as the $n^+$-type source layer 12 (see FIG. 2 (a)) in the active region 3.

With this arrangement, it is possible to form the $n^+$-type layer 32 in the outer circumferential region 4 by the same step as that for the $n^+$-type source layer 12 in the active region 3, and therefore, it is possible to simplify a step of manufacturing the semiconductor device 1.

In the sixth embodiment shown in FIG. 8, in addition to the arrangement in FIG. 6, a bottom portion p-type layer 33 is formed in the SiC substrate 2. The bottom portion p-type layer 33 has the same depth as the p-type pillar layer 22 in the active region 3 in a manner continuing to the p-type layer 31. The bottom portion p-type layer 33 is formed on the bottom surface and the side surface of the contact trench 92 so that the SiC substrate 2 is hidden below the p-type layer 31. The bottom portion p-type layer 33 is continued to the p-type layer 31 on the side surface of the contact trench 92.

With this arrangement, it is possible to generate, near the contact trench 92, a depletion layer generated by junction between the bottom portion p-type layer 33 and the SiC substrate 2 for acting as the n-type drain region (pn junction). The presence of the depletion layer can then keep the equipotential surface away from the gate insulating film 16. As a result, it is possible to alleviate the electric field applied to the gate insulating film 16, on the bottom portion of the contact trench 92. Further, it is possible to form the bottom portion p-type layer 33 in the outer circumferential region 4 by the same step as that for the p-type pillar layer 22 in the active region 3, and therefore, it is also possible to simplify a step of manufacturing the semiconductor device 1. The bottom portion p-type layer 33 may be combined with the arrangement in FIG. 7, as in the seventh embodiment shown in FIG. 9.

It is noted that although not shown in the figures, the overhung portion 27, the circular surface 28, the inclined surface 29, and the circular surface 30 shown in FIG. 3 to FIG. 9 may also be formed in the active trench 91.

Figure 10:
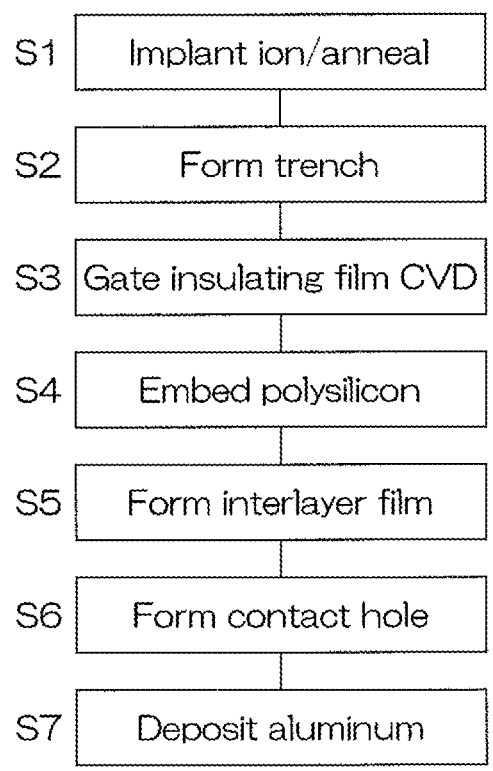
FIG. 10 is a flowchart for describing a method of manufacturing the semiconductor device.

FIG. 10 is a flowchart for describing the method of manufacturing a semiconductor device.

When the semiconductor device 1 is manufactured, an impurity is selectively implanted in the surface 21 of the SiC substrate 2, for example, to perform annealing treatment (step S1). Thus, an impurity region of the p-type channel layer 14, the $n^+$-type source layer 12, and the $p^+$-type channel contact layer 11, etc., is formed. Next, when the SiC substrate 2 is etched from the surface 21 with a predetermined pattern, the gate trench 9 (the active trench 91 and the contact trench 92) is formed on the SiC substrate 2 (step S2).

A next step is to form the gate insulating film 16 (step S3). When the gate insulating film 16 is formed, a CVD method is used under a predetermined condition (a gas flow rate, types of gas, a gas ratio, a gas supply time, etc.) so as to deposit an insulating material within the gate trench 9 so that the overhung portion 27 selectively thicker than other portions at the upper edge 26 of the contact trench 92 is formed. The gate insulating film 16 having the overhung portion 27 is thereby formed.

Figure 11:
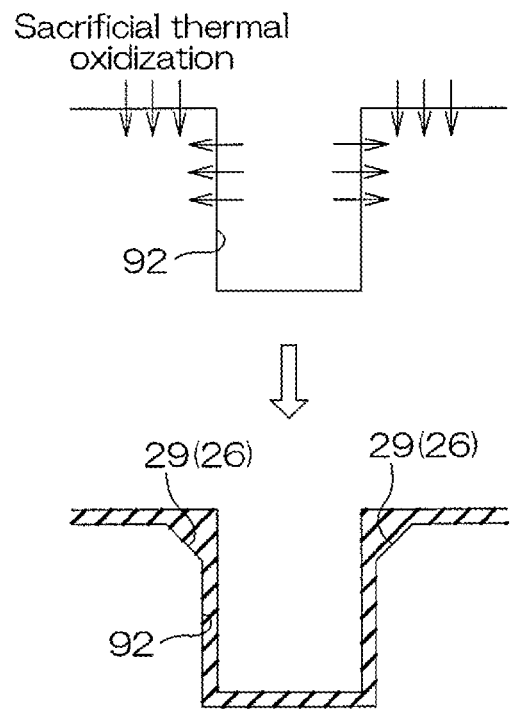
FIG. 11 is a diagram for describing a step of forming an inclined surface at an upper edge.

In this case, as shown in FIG. 4 and FIG. 6 to FIG. 9, when the inclined surface 29 is formed at the upper edge 26, after the formation of the gate trench 9 and before the formation of the gate insulating film 16, the SiC substrate 2 is thermally oxidized. Specifically, as shown in FIG. 11, when the SiC substrate 2 is thermally oxidized, the sacrificial oxide film 34 is formed. When the sacrificial oxide film 34 is formed, near the contact trench 92, the oxidization is generally started from both the surface 21 of the SiC substrate 2 and the side surface of the contact trench 92. Thus, at the upper edge 26, an oxide film that has traveled from the surface 21 of the SiC substrate 2 and an oxide film that has traveled from the side surface of the contact trench 92 are integrated before other regions. Below the oxide film integrated through the above process, the inclined surface 29 is formed. Thereafter, the sacrificial oxide film 34 may be removed to form the gate insulating film 16 by using a CVD method.

When a technique in FIG. 11 is adopted, if the p-type layer 31 and the $n^+$-type layer 32 are formed on the surface 21 of the SiC substrate 2, as shown in FIG. 6 to FIG. 9, then a thermal oxidization rate is increased in the portion than on the SiC substrate 2 for acting as the drain region, and thus, it is possible to more easily form the inclined surface 29.

Figure 12:
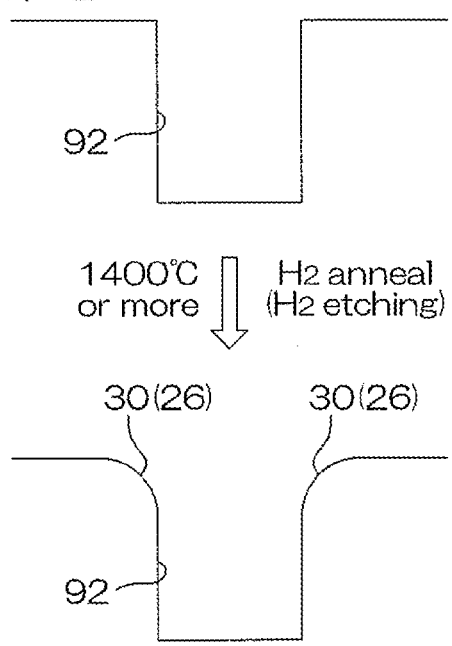
FIG. 12 is a diagram for describing a step of forming a circular surface at an upper edge.

On the other hand, as shown in FIG. 5, when the circular surface 30 is formed at the upper edge 26, after the formation of the gate trench 9 and before the formation of the gate insulating film 16, the $H_2$ annealing treatment is performed on the SiC substrate 2. Specifically, as shown in FIG. 12, when $H_2$ anneal ($H_2$ etching) is performed with 1400° C. or more on the SiC substrate 2, the circular surface 30 is formed at the upper edge 26.

Returning to FIG. 10 again, after the formation of the gate insulating film 16, the polysilicon is deposited until the entire gate trench 9 is hidden to fill the gate trench 9 with the polysilicon (step S4). Then, when the deposited polysilicon is patterned, the polysilicon outside the active trench 91 is removed in the active region 3, and at the same time, the polysilicon is left as the overlap portion 17 in the outer circumferential region 4.

Next, by using a CVD method, the interlayer film 23 is formed on the SiC substrate 2 (step S5). Next, when the interlayer film 23 is patterned, the contact hole 24 and the contact hole 25 are formed simultaneously (step S6).

Then, by using a sputtering method and an evaporation method, a metal material such as aluminum is deposited on the interlayer film 23 (step S7). As a result, the source pad 5, the gate pad 7, and the gate finger 8 are formed. Through the above steps, the semiconductor device 1 shown in FIG. 1 is obtained.

Although the embodiments of the present invention have heretofore been described, the present invention can be further embodied in other forms.

For example, an arrangement may be adopted in which the conductive type of each of the semiconductor portions of the forgoing semiconductor device 1 is inverted. For example, in the semiconductor device 1, the p-type portions may be n-type and the n-type portions may be p-type.

Further, the semiconductor adopted in the semiconductor device 1 may not only be SiC but also be Si, GaN, diamond, etc., for example.

The overlap portion 17 may be formed not only in the outer circumferential region 4 but also in the active region 3. For example, when only a portion around the opening end of the active trench 91 is covered in so far as the upper surface of each unit cell 10 is not hidden, the overlap portion 17 may also be formed in the active region 3. In this case, if the overhung portion 27 is formed also in the active trench 91, then it is possible to obtain the withstand voltage improvement effect in much the same way as in the above. That is, the structure immediately below the gate finger 8 is merely an example exhibiting the effect of the withstand voltage improvement effect by the overhung portion 27 according to the present invention, and thus, a structure capable of obtaining a similar effect may be provided not only to the gate finger portion.

In addition, it is possible to make various design changes within the scope of the features described in CLAIMS.

REFERENCE SIGNS LIST

1 Semiconductor device
2 SiC substrate
21 Surface
3 Active region
4 Outer circumference region
8 Gate finger
9 Gate trench
91 Active trench
92 Contact trench
12 $n^+$-type source layer
14 p-type channel layer
15 Gate electrode
16 Gate insulating film
17 Overlap portion
18 Side-surface insulating film
19 Bottom-surface insulating film
20 Planar insulating film
22 p-type pillar layer
23 Interlayer film
26 Upper edge
27 Overhung portion
28 Circular surface
29 Inclined surface
30 Circular surface
31 p-type layer
32 $n^+$-type layer
33 Bottom portion p-type layer
34 Sacrificial oxide film

The invention claimed is:

1. A semiconductor device comprising:
a semiconductor layer of a first conductive type formed thereon with a gate trench;
a gate insulating film formed on a side surface and on a bottom surface of the gate trench, the gate insulating film integrally including a side-surface insulating film on the side surface and a bottom-surface insulating film on the bottom surface; and
a gate electrode embedded in the gate trench, the gate electrode selectively having an overlap portion overlapping the surface of the semiconductor layer in an upper edge formed at an opening end of the gate trench, wherein
the side-surface insulating film includes an overhung portion selectively thicker than other portions of the side-surface insulating film so as to protrude inwardly of the gate trench at the upper edge,
the semiconductor layer includes an active region in which a trench gate type MIS transistor is formed and an inactive region outside the active region and in which the overhung portion is formed, and
in the active region, the semiconductor layer further includes:
a first conductive-type source layer exposed at the surface side of the semiconductor layer to define a portion of the side surface of the gate trench;
a second conductive-type channel layer contacting the source layer at a back surface side of the semiconductor layer relative to the source layer to define a portion of the side surface of the gate trench;
a first conductive-type drift layer contacting the channel layer at the back surface side of the semiconductor layer relative to the channel layer to define the bottom surface of the gate trench; and
a second conductive-type pillar layer which is formed within the drift layer in a manner continuous with the channel layer and which extends from the channel layer toward the back surface of the semiconductor layer, and in the inactive region, the semiconductor layer further includes:
a bottom portion second conductive-type layer which is formed at the same depth as the pillar layer and which defines the bottom surface of the gate trench.

2. The semiconductor device according to claim 1, wherein the upper edge of the gate trench includes an inclined surface allowing continuation between the surface of the semiconductor layer and the side surface of the gate trench.

3. The semiconductor device according to claim 1, wherein the upper edge of the gate trench includes a circular surface allowing continuation between the surface of the semiconductor layer and the side surface of the gate trench.

4. The semiconductor device according to claim 1, wherein the bottom-surface insulating film is thicker than other portions of the side-surface insulating film.

5. The semiconductor device according to claim 1, wherein the gate insulating film further includes a planar insulating film formed on the surface of the semiconductor layer, and
the planar insulating film is thicker than other portions of the side-surface insulating film.

6. The semiconductor device according to claim 1, wherein a lower edge on the bottom portion of the gate trench includes a circular surface allowing continuation between the side surface and the bottom surface of the gate trench.

7. The semiconductor device according to claim 1, wherein
the semiconductor layer includes a second conductive-type layer in the inactive region formed at the same depth as the channel layer, and
the bottom portion second conductive-type layer is formed in a manner extending from the second conductive-type layer.

8. The semiconductor device according to claim 7, wherein, in the inactive region, the semiconductor layer further includes:

a first conductive-type layer formed at the same depth as the source layer.

9. The semiconductor device according to claim 1, wherein the inactive region includes an outer circumferential region surrounding the active region, and
the semiconductor device includes a gate finger which is arranged to surround the active region along the outer circumferential region, and is electrically connected to the overlap portion of the gate electrode.

10. The semiconductor device according to claim 9, wherein the gate trench has a lattice shape in the active region and has a stripe shape pulled from the end of the lattice-shaped trench in the outer circumferential region, and
the gate finger is laid along a direction to cross the stripe-shaped trench.

11. The semiconductor device according to claim 9, wherein the semiconductor device further includes an interlayer film formed on the surface of a semiconductor layer to cover the gate electrode, and
the gate finger includes, in a width direction center thereof, a contact portion contacting the gate electrode to penetrate through the interlayer film.

12. The semiconductor device according to claim 11, wherein the contact portion is formed linearly to surround the active region along the outer circumferential region.

13. The semiconductor device according to claim 9, wherein the gate electrode includes polysilicon and the gate finger includes aluminum.

* * * * *